US008913766B2

(12) United States Patent
Bominaar-Silkens et al.

(10) Patent No.: US 8,913,766 B2
(45) Date of Patent: Dec. 16, 2014

(54) ACOUSTIC TRANSDUCERS WITH PERFORATED MEMBRANES

(75) Inventors: Iris Bominaar-Silkens, Valkenswaard (NL); Andres Felipe Vasquez Quintero, Neuchatel (CH); Klaus Reimann, Eindhoven (NL); Twan Van Lippen, Bladel (NL); Remco Henricus Wilhelmus Pijnenburg, Hoogeloon (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/597,709

(22) Filed: Aug. 29, 2012

(65) Prior Publication Data

US 2013/0056840 A1    Mar. 7, 2013

(30) Foreign Application Priority Data

Sep. 2, 2011    (EP) ..................................... 11179806

(51) Int. Cl.
H04R 25/00    (2006.01)
H04R 19/00    (2006.01)
B81B 3/00    (2006.01)
B06B 1/02    (2006.01)

(52) U.S. Cl.
CPC ............ B81B 3/0072 (2013.01); H04R 19/005 (2013.01); *B81B 2203/0127* (2013.01); B06B 1/0292 (2013.01); *B81B 2201/0257* (2013.01)
USPC .............................. 381/174; 381/150; 381/386

(58) Field of Classification Search
USPC .......................................... 381/174, 150, 386
See application file for complete search history.

(56) References Cited

U.S. PATENT DOCUMENTS

| 1,877,868 | A | 9/1932 | High | |
|---|---|---|---|---|
| 4,249,043 | A * | 2/1981 | Morgan et al. | ................ 381/170 |
| 5,303,210 | A | 4/1994 | Bernstein | |
| 8,395,285 | B2 | 3/2013 | Huang | |
| 8,503,699 | B2 * | 8/2013 | Dehe | ............................ 381/150 |
| 2007/0201710 | A1 | 8/2007 | Suzuki et al. | |
| 2008/0304681 | A1 | 12/2008 | Langlois et al. | |
| 2011/0075866 | A1 | 3/2011 | Zhang | |
| 2011/0123043 | A1 * | 5/2011 | Felberer et al. | .............. 381/94.2 |
| 2012/0099753 | A1 * | 4/2012 | van der Avoort et al. | ..... 381/361 |
| 2013/0285173 | A1 | 10/2013 | Reimann et al. | |

FOREIGN PATENT DOCUMENTS

| CN | 101219425 A | 7/2008 |
|---|---|---|
| CN | 201438755 U | 4/2010 |
| EP | 2 071 871 A1 | 6/2009 |

(Continued)

OTHER PUBLICATIONS

Zuckerwar, A J. "Theoretical Response of Condenser Microphones", J. of the Acoustical Society of America, vol. 64, No. 5, pp. 1278-1285 (1978).

(Continued)

*Primary Examiner* — Davetta W Goins
*Assistant Examiner* — Amir Etesam (57) ABSTRACT

A MEMS device, such as a microphone, uses a fixed perforated plate. The fixed plate comprises an array of holes across the plate area. At least a set of the holes adjacent the outer periphery comprises a plurality of rows of elongate holes, the rows at different distances from the periphery. This design improves the mechanical robustness of the membrane and can additionally allow tuning of the mechanical behavior of the plate.

19 Claims, 7 Drawing Sheets

(56) References Cited

FOREIGN PATENT DOCUMENTS

| JP | 2004-128957 A | 4/2004 |
|---|---|---|
| WO | 2010/113107 A1 | 10/2010 |
| WO | 2010/116324 A1 | 10/2010 |
| WO | 2010/122487 A1 | 10/2010 |

OTHER PUBLICATIONS

Bergqvist, J. et al. "A Silicon Condenser Microphone with a Highly Perforated Backplate", Int'l. Conf. on Solid-State Sensors and Actuators, Digest of Technical Papers, Transducers'91, pp. 266-269 (1991).

Wolfe, J. C. et al. "Distortion Analysis of Stencil Masks with Stress-Relief Structures", J. of Vacuum Science & Techn. B, vol. 13, No. 6, pp. 2613-2617 (1995).

Homentcovschi, D. et al. "Modeling of Viscous Damping of Perforated Planar Microstructures. Applications in Acoustics", J. Acoustical Society of America, vol. 116, No. 5, pp. 2939-2947 (Nov. 2004).

Homentcovschi, D. et al. "Viscous Damping of Perforated Planar Micromechanical Structures", Sensors and Actuators a Phys., vol. 119, No. 2, pp. 544-552 (2005).

Goto, M. et al. "High-Performance Condenser Microphone with Single-Crystalline Silicon Diaphragm and Backplate", IEEE Sensors Journal, vol. 7, No. 1, pp. 4-10 (2007).

Frangi, A. et al. "On a Deterministic Approach for the Evaluation of Gas Damping in Inertial MEMS in the Free Molecule Regime", Sensors and Actuators A 149, pp. 21-28 (2009).

Ganji, B. A. et al. "High Sensitivity and Small Size MEMS Capacitive Microphone Using a Novel Slotted Diaphram", Microsystem Technologies, vol. 15, No. 9, pp. 1401-1406 (2009).

Extended European Search Report for European Patent Appln. No. 11179806.2 (Feb. 8, 2012).

Office Action from Counterpart Application CN 201210320293.2 (Jul. 30, 2014).

\* cited by examiner

ACOUSTIC TRANSDUCERS WITH PERFORATED MEMBRANES

CROSS-REFERENCE TO RELATED APPLICATIONS

This application claims the priority under 35 U.S.C. §119 of European patent application no. 11179806.2, filed on Sep. 2, 2011, the contents of which are incorporated by reference herein.

This invention relates to acoustic transducers with perforated membranes. In particular, this invention relates to the design of perforated membranes to tolerate tensile stresses.

Condenser microphones consist of two membranes: a membrane that is actuated by the sound pressure and a perforated membrane which forms a counter-electrode ("backplate") that does not move in response to sound pressure, as the perforations render it acoustically transparent. The perforations allow the first membrane to move without pressure build-up in the volume between membrane and backplate.

In the presence of mechanical vibrations, also known as "body noise", both plates are actuated. Due to differences in plate properties, the plates are actuated differently, so that the body noise results in relative movement of the plates. In the case of a microphone sensor, this relative movement is undesirably detected and, thus, reduces the sensor performance. In order to make the sensor intrinsically insensitive to body noise, the backplate must be designed such that it has the same response to mechanical vibrations as the membrane.

Both membrane and backplate are typically fabricated in tensile stressed layers. As the tension in the backplate might have an effect on the membrane properties or might lead to cracks, a method is needed to relax the stress in the backplate, so that the unwanted effect on the membrane is reduced.

Both stress relaxation and body-noise compensation can be achieved by attaching the backplate to elastic suspensions, such as springs. Spring-suspended (initially tensile-stressed) plates experience stress built-up at the anchors, as the plates are only attached at a limited number of sites along the plate's perimeter. This stress built-up decreases the robustness of these backplates. Also, when a spring-suspended plate is used, there is more backplate material removed near the rim of the plate than in the center. This might lead to processing problems associated with the resulting inhomogeneity of the sacrificial layer etch.

In conventional microphones with relatively large spacing between the two membranes, a few large holes in a rigid backplate are sufficient to reduce the effect of air damping. However, in miniature microphones that are built as micromechanical systems (MEMS) in Si-technology, the backplate is not rigid and should be perforated all over the plate to prevent air flow resistance, and this also enables it to be released by sacrificial layer etching.

It is noted that such perforations are also used in other moving or static MEMS-structures such as MEMS switches or MEMS variable capacitors, MEMS electroacoustic transducers, filters for gases or liquids.

Typically, a periodic pattern of square or circular holes is used, although rectangular holes have been proposed, in a more intricate pattern, for example as reported in M. Goto et al., High-performance condenser microphone with single-crystalline Si diaphragm and backplate, IEEE Sensors Journal 7, p. 4 (2007). A translational-periodic pattern of holes has the advantage that stress-gradients in the direction of the membrane normal (perpendicular to the membrane or in a vertical direction of the cross-section) do not cause a deflection of the two counter electrodes towards or away from each other. Any deflection of the backplate changes the equilibrium capacitance of the microphone.

Figure 1:
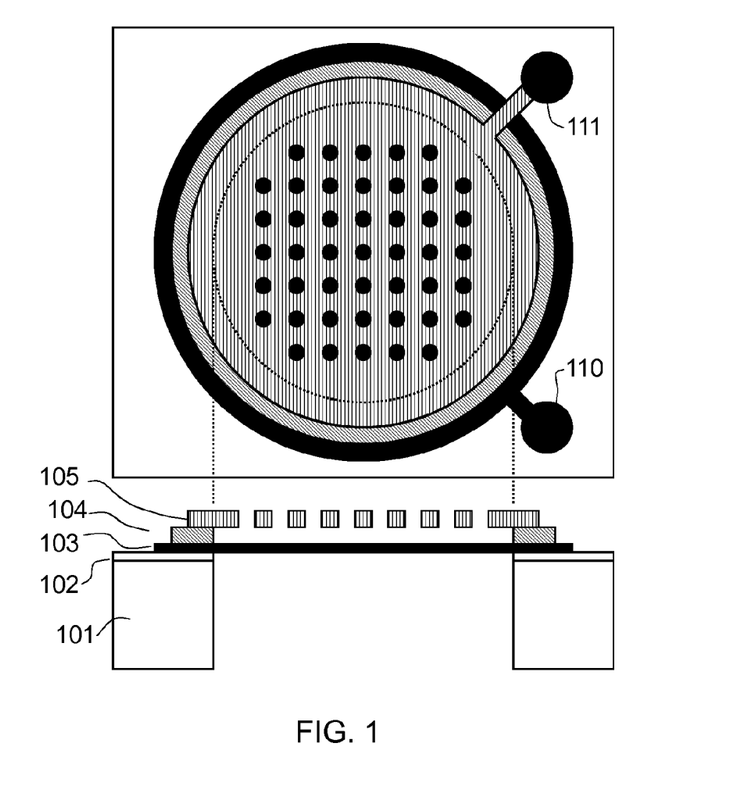
FIG. 1 shows a known microphone design.

FIG. 1 shows a top-view and cross-section through a (MEMS) condenser microphone.

The Si substrate 101 has an opening which exposes a part of the movable membrane 103 which is sensitive to acoustic pressure. The movable membrane is formed over an (optional) insulator 102. The backplate 105 (a fixed membrane) is suspended over a further insulator 104 and is perforated with a regular pattern of holes. The electrode connections 110,111 are to the two membranes and are used to measure the capacitance.

An issue in the fabrication of MEMS devices is that stress gradients are difficult to control in processing, and this invention is based on a design of the perforations to reduce the influence of stress gradients. The invention also relates to designs which enable control of the sensitivity to acceleration and vibrations.

According to the invention, there is provided a MEMS device comprising a fixed membrane and a movable membrane separated by a gap, wherein the movement of the movable membrane is sensed or controlled to provide the operation of the device, wherein the fixed membrane comprises an array of holes across the membrane area, wherein at least a set of holes which are provided adjacent the outer periphery of the fixed membrane comprise a plurality of rows of elongate holes, the rows at different distances from the periphery.

This design uses elongated holes (i.e. slots). This design improves the mechanical robustness of the membrane and can additionally allow tuning of the mechanical behaviour of the plate, such as its resonance frequency. Preferably the holes in one row are staggered with respect to the holes in another row, so that straight connecting lines across the rows (from one edge of the membrane to the other) are avoided.

The spring constant of the hole (perforation) pattern can be tuned by changing the elongation of the holes, for example in the tangential direction.

The holes act as elastic suspensions. An appropriate design can allow for body-noise compensation. The elongated shape of the holes improves the stress relaxation in the plate. The final stress in the plate is smaller for the tangentially elongated staggered holes than for common uniform patterns of square or circular holes.

By "fixed" (in respect of the fixed membrane is meant that the membrane is not intended to move in order to generate the signal in response to the audio input (in the case of a microphone) or move in order to generate the output signal (in the case of an output device). Some movement relative to the device substrate is possible however, for example for tolerance of external accelerations (so called "body noise compensation").

In one example, the elongate direction of each hole extends generally along the direction of the outer periphery. This is perpendicular to the typical line of maximum bending, which is along the radius. In cases where the membrane bends differently, the elongate direction may be different so that it is again perpendicular to the line of maximum bending. By "extending generally along the direction of the outer periphery" is meant that the elongate holes extend in the tangential direction rather than the radial direction. This does not mean the membrane shape has to be a circle. Rather, the row of holes forms a shape which matches the outer periphery—but a scaled down version. Each hole is in the direction of the nearest part of the outer periphery. It should also be understood that the holes are generally oriented in the tangential direction, but part of the hole shape can extend in different directions or the holes can be tilted away from tangential direction, but should basically be tangential to achieve best stress relaxation. Some holes may also be connected in the radial direction to other holes, so that spring like patterns can be formed.

The fixed membrane is preferably clamped along its full perimeter. The stress built-up is thus not concentrated at a limited number of anchors, as is the case for suspension by springs. Hence, the robustness is increased. Thus, the design provides body noise suppression in the same way as the use of spring anchors, but avoids the stress build up at discrete anchors.

The holes in one row can be a scaled version (in length and optionally also in width) of the holes in an adjacent row.

The array of holes may comprise a plurality of segments, wherein each segment has the same effective bending moment, wherein the previously defined set of holes comprise an outermost segment. This effective bending moment is the product of the bending stiffness and the effective, relaxed stress-gradient. The effective stress gradient can change with pattern. The effect is that the membrane should not buckle if clamped at the edges. Ignoring the relaxed stress-gradient, the segments are designed to have the same bending stiffness (or an average bending stiffness over several segments within a part of the membrane with the same average bending stiffness as for other parts of the membrane). Thus, local variations in bending stiffness can be tolerated, as long as the average bending stiffness over one significant area of the membrane (e.g. 10% or more) is the same as for any other significant area.

This design provides a way to design clamped, perforated membranes such that they are insensitive to stress gradients. This facilitates high (average) stress relaxation.

The use of segments means that the fixed membrane is constructed from several segments with different perforation patterns. The segments are designed such that they have the same radial bending moment to be insensitive to stress gradients. The boundaries can be adapted such that the patterns match for best compensation. Scaling can be used within segments to keep the design effort low.

The fixed membrane and the movable membrane can be circular, and each row of holes of the set then comprises a circle at a fixed radius.

Within the outermost segment, each row has longer holes than the adjacent row on the radial inner side, such that the hole length is proportional to the radial distance from the centre. This means the same number of holes fits around the circumference, and adjacent rows can have staggered holes all around the rows. The hole width can also scale with radius for most uniform scaling, but it may also remain constant.

Within an innermost segment, nearest the centre, the holes can also comprise a plurality of rows of elongate holes, the rows at different distances from the periphery, and the holes in one row being staggered with respect to the holes in another row. Thus, the membrane design can comprise a number of scaled similar designs.

The holes of the outermost row of the innermost segment are then longer than the holes of the innermost row of the outermost segment. Thus, at a boundary between segments (in the direction towards the centre), the hole length increases, so that the holes remain elongate, and manufacturing tolerances are not exceeded.

However, within the innermost segment, the holes can instead comprise a plurality of openings of unity aspect ratio (i.e. circular or square).

The device can comprise a microphone.

Examples of the invention will now be described with reference to the accompanying drawings, in which.

The invention provides a MEMS device such as a microphone, which uses a fixed perforated plate. The fixed plate comprises an array of holes across the plate area. At least a set of the holes adjacent the outer periphery comprises a plurality of rows of elongate holes, the rows at different distances from the periphery. The holes in one row are staggered with respect to the holes in another row.

Figure 2:
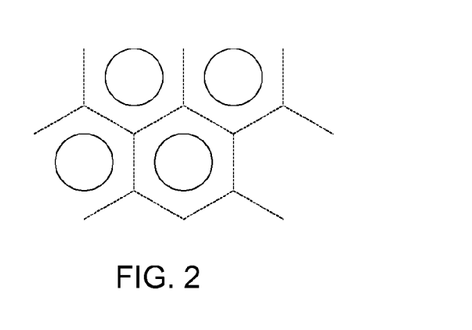
FIG. 2 shows a known perforation design for the microphone backplate.

As outlined above, perforation patterns in elastic plates in MEMS devices are typically used to reduce air damping and/or to allow removal of a sacrificial layer during the fabrication process. For these applications, periodic patterns of circular or square holes are typically used. Commonly, the periodic patterns are such that the area is divided into unit cells, each containing one hole, as illustrated in FIG. 2.

A first aspect of the invention is based on the use of a perforation pattern with holes that are not circular or square, but that have an aspect ratio that deviates from 1:1. In one example, by shaping the holes such that they are elongated parallel to the rim (the outer periphery) of the plate, more stress relaxation can be achieved in the direction perpendicular to the rim.

Figure 3:
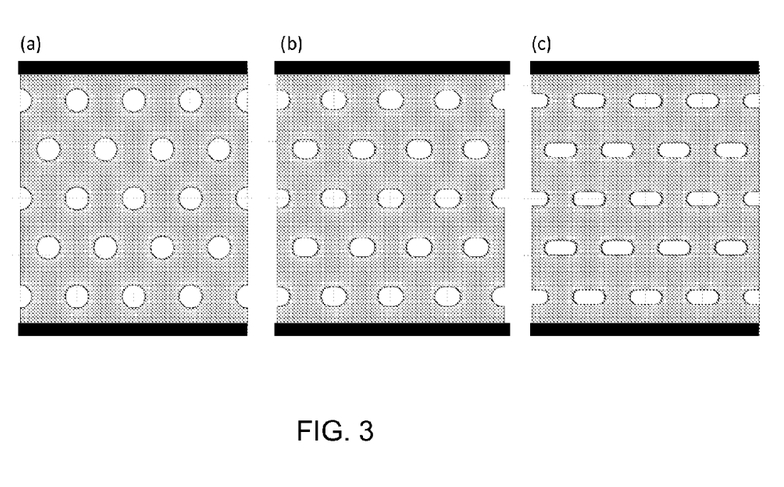
FIG. 3 shows various possible perforation hole designs including the perforation hole design used in the device of the invention.

FIG. 3 illustrates three patterns for a clamped-clamped beam structure in top view. The top and bottom rectangles indicate where the rim is clamped. Three hole shapes are shown, with different stress relaxation: FIG. 3(a) shows circular holes in a hexagonal pattern, FIG. 3(b) shows slightly elongated holes, having the same area as the circular holes in FIG. 3(a), positioned in the same hexagonal pattern. FIG. 3(c) shows holes that are more elongated, still with the same hole area and cell pattern.

A comparison of circular and elongated holes shows that elongated holes, having the same area as the circular holes, result in more efficient stress relaxation. Finite-element calculations indicate that the pattern in FIG. 3(a) results in a final stress that is 69% of the original, as-deposited layer stress. The final stresses as a result of the pattern in FIG. 3(b) and the pattern in FIG. 3(c) are 66% and 55% of the original stress, respectively.

The stress in the direction perpendicular to the rim is analysed, as this is a measure for the force that the anchor has to withstand (the lower the stress, the better the robustness).

A microphone sensor typically has a circular perforated plate. Examples of the proposed slotted perforation pattern for such a circular plate are illustrated in the FIGS. 4 and 5, showing pie-pieces (1/12) of a circular plate that is clamped at its perimeter.

Figure 4:
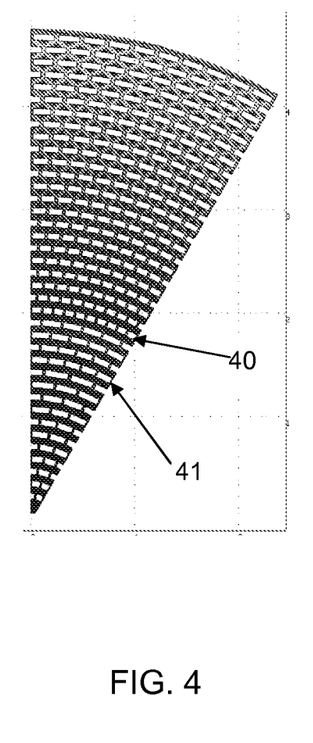
FIG. 4 shows a first design of fixed membrane in accordance with the invention.
Figure 5:
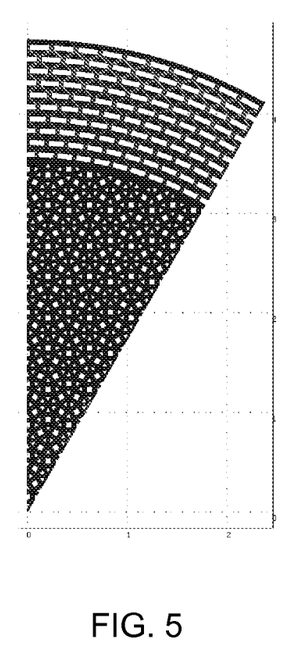
FIG. 5 shows a second design of fixed membrane in accordance with the invention.

FIG. 4 shows a plate where the pattern contains only slots, while FIG. 5 illustrates a solution with slots only nearer the outer rim of the plate and a different pattern in the center. The central perforation pattern is less bound by constraints and can, for example, be optimised for the signal-to-noise ratio of the sensor.

As shown in FIG. 4, the holes are formed in circular rows. Each row has elongate slots which are staggered (by half a slot length) with respect to the next row. This means there are no straight line connections across the plate. To enable the staggered (brick-like) pattern to be maintained, the slots decrease in length nearer the centre. Eventually (at the row marked as 40) the shape approaches a unity aspect ratio (i.e. a square). There is then a step transition to a longer hole shape as shown.

Thus, the design of FIG. 4 has a number of segments. The outermost segment ends at the periphery of the membrane, and the innermost segment ends at the center. The design of FIG. 4 in fact has three segments, with a transition at the row shown as 41.

Within the segment, each row is a scaled version (in length) of the adjacent segments, so they have the same number of slots all the way around, but fit to the different radius. At the transition to the next segment, there is a larger step change in the length of the slots, and a corresponding step change in the number of slots that fit along the entire row.

In FIG. 5, there is a set of rows of elongate holes near the outer periphery of the plate, and circular holes nearer the centre of the plate. This design has only two segments, and only the outermost segment has the elongate staggered slot design.

In the design of FIG. 4, the stress increases from the centre radially outwardly. In FIG. 5, the stress is more uniform across the plate.

The holes used in FIGS. 4 and 5, at least near the outer periphery, are tangentially elongated, and these allow more efficient stress relaxation in addition to the reduction of air damping. The more efficient stress relaxation offers the possibility to achieve more robust plates and/or body-noise compensation.

In FIGS. 4 and 5, the hole pattern is designed as a number (three and two in these examples) of segments with different perforation patterns.

The different segments can be designed in various ways to achieve different possible objectives. The designs of FIGS. 4 and 5 aim to provide robust membranes and enable tuning of the stress relaxation, so that the segments are designed for effective stress relaxation. An alternative design parameter is for the segments to be designed such that they are insensitive to stress gradients.

The boundaries are designed such that the patterns match for best compensation. If needed, FEM simulations can be used to construct the boundaries. A simulation of the full plate is not needed, and simulation can be based on angular segments as shown. Scaling can be used within segments to keep the design effort low.

In FIGS. 4 and 5, the row height is kept the same, so that as the slot length decreases, the aspect ratio tends towards 1:1. The slot width can also scale with radius.

Figure 6:
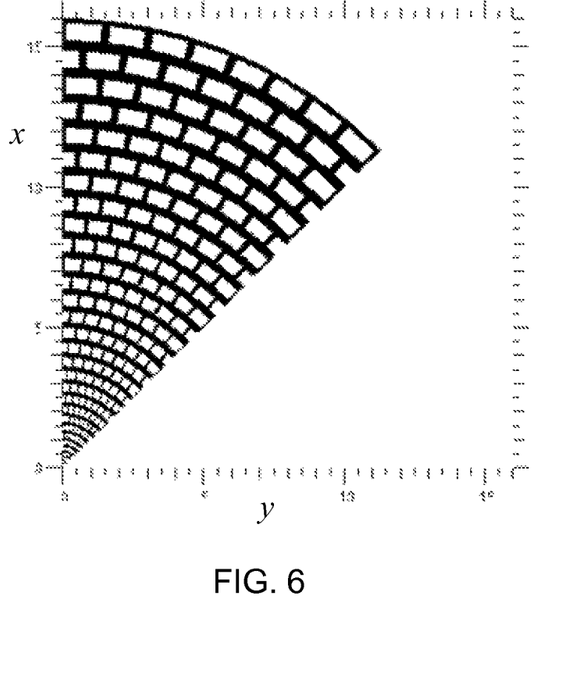
FIG. 6 is used to show why a particular single-segment design is not practically feasible using simple scaling.

The use of multiple segments makes the pattern possible to manufacture from a practical point of view. For example, the radial-symmetric pattern of FIG. 6 (which shows 1/8 of a circle) is scaled with the radius—with both the slot length and width scaling. The scaling preserves (on average) the bending stiffness. However, this pattern cannot be manufactured because the pattern is too large at the outer rim to be released by the sacrificial layer etch or too small for the process resolution at the center of the backplate. Typically, the smallest dimensions for the hole diameter are 0.25 to 0.5 μm for holes and 10 to 20 μm width between two openings.

Mechanical stresses in layers are inevitably introduced during processing, e.g., after cooling from high temperatures. Stress gradients can occur if the layer deposition is not constant over time, if the substrate influences the growth of the membrane layer or if bi- or multiple layers are used.

Figure 7:
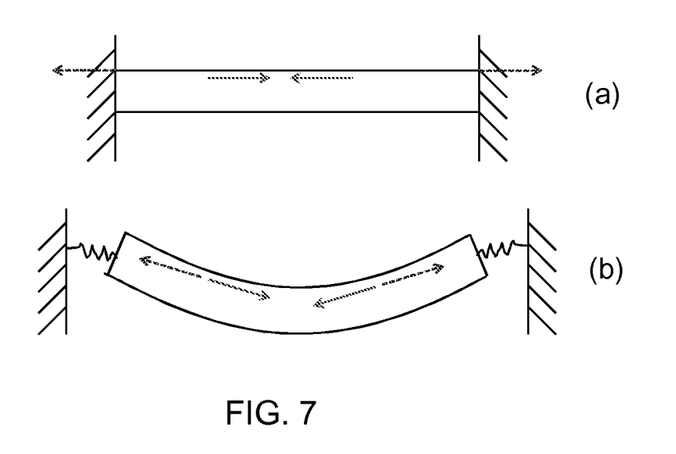
FIG. 7 is used to show why stiffness variations can cause membrane deflection when stress gradients exist.

FIG. 7 schematically shows how a stress gradient leads to a membrane (backplate) deflection. The top part of the backplate layer has a higher stress (indicated by the solid arrows) than the bottom part. In this case it is a tensile stress meaning that the top layer wants to shrink, whereas the bottom part has less stress. If the membrane is clamped as shown in FIG. 7(a), then the stress in the top part of the backplate layer is compensated by the clamp. The resulting net bending moment is zero and the backplate stays flat.

In the case of a free layer as shown in FIG. 7(b), the internal stress is compensated by shrinkage of the top part until the elastic stress by deformation compensates the built-in stress. The backplate deforms. The same happens if it is attached to the substrate by a soft spring (an elastic suspension) or a soft part of the backplate.

To keep a zero deflection of the backplate (or any membrane) the bending moment should be the same in all parts of the backplate, at least on a mesoscopic average. Local imperfections can be allowed, depending on the application and the magnitude of the stress gradient. For example, the stress should average out over distances of 30% and more preferably 20% or even 10% of the radius. Thus, over any distance of 30% (or more preferably 20% or even 10%) of the radius, the average stress is approximately the same. The design then compensates for the bending moments and the backplate remains flat.

Deflection can be avoided by the use of thick layers, but thin layers desired for MEMS processing can contain considerable stress gradients. Most MEMS backplate perforations are therefore translational periodic patterns to achieve the same bending stiffness anywhere.

All non-periodic or non-uniform patterns require control over the stress gradient. A deflection can be compensated in the application, but it is difficult to provide a compensation if the variation of the deflection during production is large from wafer to wafer or on different locations on the wafer. This would strongly reduce the yield and increase costs. Sometimes it is also not possible to avoid stresses and stress gradients due to the use of mass-production deposition tools that are optimized for high throughput instead of good stress control. If the average stress of the layer is fairly well controlled, then this does not mean that also the stress gradient is well controlled. The invention addresses both of these issues.

It is advantageous for a microphone that the backplate stress can be tuned by design such that the microphone becomes insensitive to acceleration and vibrations. This can also be done by stress tuning during deposition, but it might lead to unstable production processes, because a low stress is needed. Using the conventional periodic patterns, such as a honeycomb pattern, would then lead to very fragile patterns with a thin silicon grid.

An approximate technique to design the desired pattern is explained in the following test, which starts from a 1D-periodic slot or shifted-square pattern (FIG. 8(a)). This pattern has the transitions between segments, where the rows within a segment have the same number of cells, but there is a step at the segment boundaries.

The unit cell is denoted by 301. The cell is then stretched along the φ-axis to the desired angle (in this case 45 deg=π/4) to yield the block of constant angle shown in FIG. 8(*b*). This is then transformed to a radial segment as shown in FIG. 8(*c*).

If the scaled unit cells become too large (for larger radii), then more unit cells are added on a ring. This can be done, e.g., by a fixed multiplier f. FIG. 8(*a*) uses a multiplier of two: the number of unit cells is doubled at each radial segment boundary. FIG. 8 shows a design with four segments.

The scaling transformation for each ring segment becomes:

$$\varphi = \varphi_{max} \frac{x}{x_{max}}, R_1 = ay \quad (1)$$

and $$R = \frac{nR_1^2 + fR_0^2}{R_0(1+f)}, x' = R\sin(\varphi), y' = R\cos(\varphi). \quad (2)$$

Figure 8A:
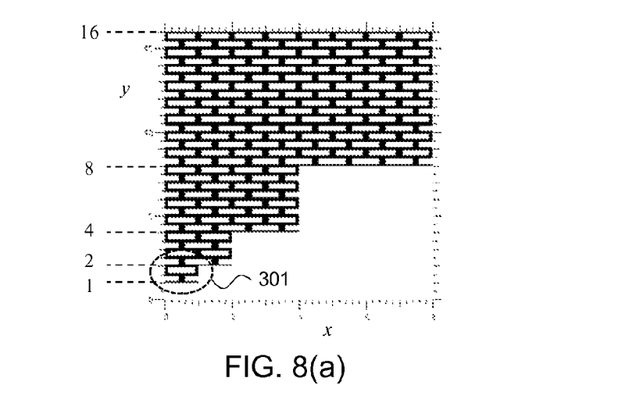
FIG. 8 shows how the multiple-segment design of the invention can be optimised.
Figure 8B:
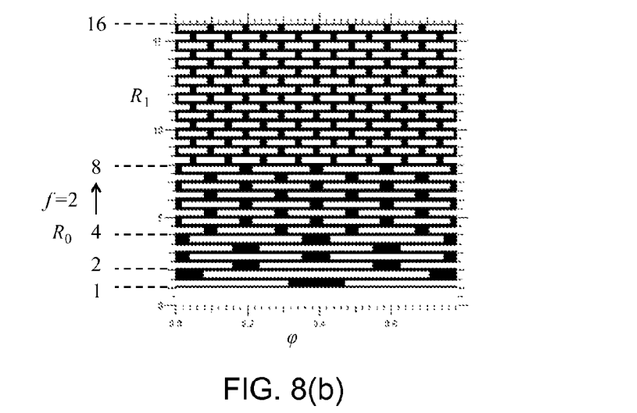
Figure 8C:
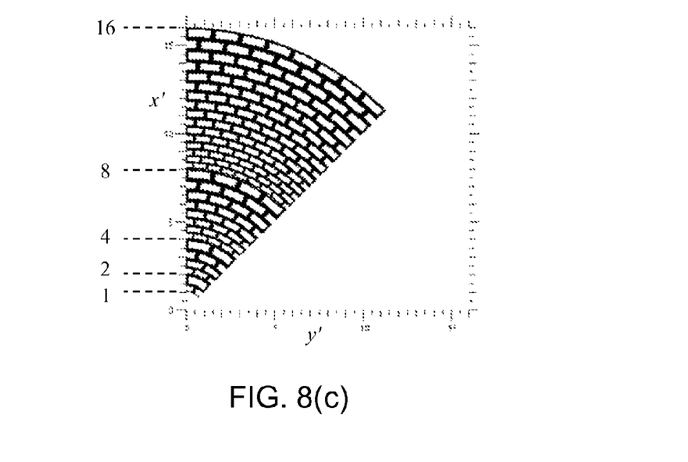

Equation (1) is the step from FIG. 8(*a*) to FIG. 8(*b*) and equation (2) to FIG. 8(*c*). f denotes the ratio of the inner and outer radius of the segment, $\varphi_{max}$ the angular section of the pattern, a is an arbitrary radius scaling factor from y to $R_1$, and $R_0$ is the start radius of a segment (FIG. 8(*b*)).

The use of integer numbers for the stepping factor f has the advantage that the patterns fit well to each other at the stepping border. But other factors are possible as well, for example if it is desired to have less change in the size of the unit cell.

Figure 9:
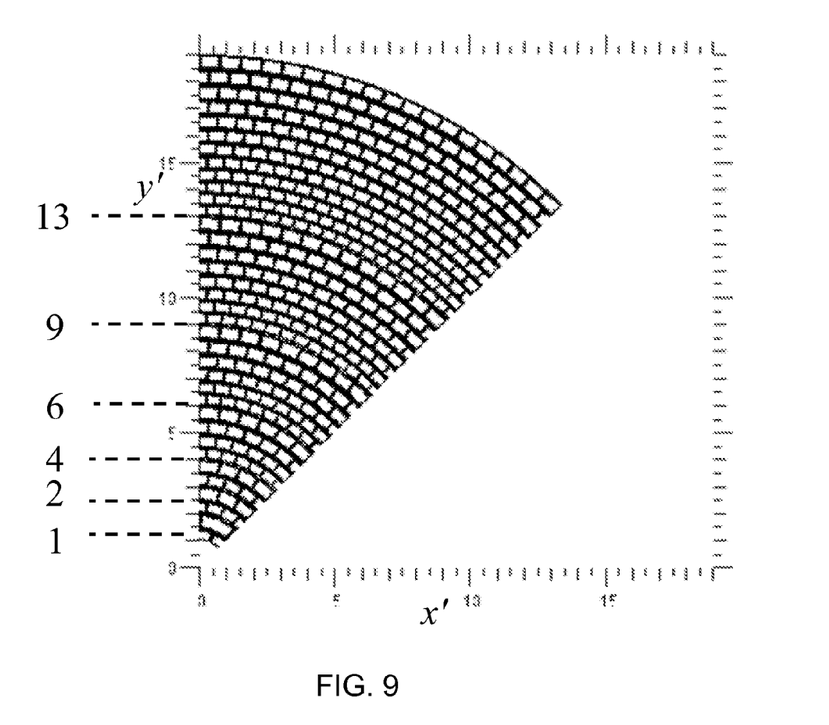
FIG. 9 shows a six segment design of fixed membrane in accordance with the invention.

FIG. 9 is an example where smaller steps are used (f≈1.5), and the result is more segments—six in this example. The value of f also does not need to be the same at each segment boundary.

It is noted that the designs of FIGS. 8c and 9 segment the pattern into radial segments with the same bending stiffness and enable stress tuning without requiring very thin grid lines.

The technique is an approximation. The borders between ring segments and the overall layout might need fine-tuning. Finite element techniques could be used. If an integer fraction of f is used, then simulation of small segments could be sufficient.

Figure 10:
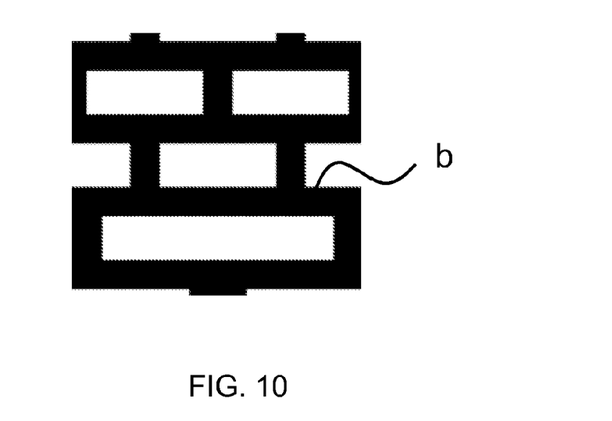
FIG. 10 shows a unit cell at the boundary between two segments for use in the design process.

FIG. 10 shows an example of a single border segment. The width of the beam "b" can be parameterised and the optimum value for stress-gradient insensitivity can be simulated. The center part of each segment could be handled the same way.

The technique is not limited to ring segments or circular membranes. Several segments that are sensitive to stress gradients could for example be combined such that the overall effect is zero and only local, small deflections occur. Also tapering of the holes in the vertical direction that occur by the etching process can be taken into account when optimizing the patterns.

The hole pattern is non-translational-periodic or non-uniform, and gives a constant bending moment. The design is then insensitive to stress gradients.

The invention can be used in body-noise compensated microphones, or mechanically optimized backplates. The invention provides more robust plates and/or body-noise compensation by appropriate perforations.

As is clear from the above, the invention is of particular interest for microphones. However, it can be applied to other types of device, such as MEMS switches, MEMS varicaps, MEMS acoustic transducers, microvalves, or microfilters.

The invention applies the hole pattern to the fixed membrane, and these holes can be those used for sacrificial etch release.

FIG. 1 shows a microphone with the pressure-sensitive membrane at the bottom, but the invention can equally be applied to microphones where the pressure sensitive membrane is above the insensitive membrane.

The pressure-insensitive membrane is typically formed of silicon, but other materials may be used, such as Al or Au or multilayers of SiNx, SiOxNy, SiC or SiO2 and conductors such as Si, Al, Ti, W, TiN, TiW, Au, ITO, Pt.

The invention is implemented as a change in the hole pattern, but this does not require any change to the known deposition and patterning processes used to form the device, and for this reason, the method of manufacturing the device has not been described in detail.

As explained above, the design may be chosen to provide stress relaxation (to avoid cracks, and to provide body noise compensation) or to reduce stress gradients by designing the segments with the same effective bending moment (to avoid buckling and to improve sensitivity). Another possible design aim is for the average stress of the fixed and movable membrane to be such that the resonance frequencies of the fixed and movable membranes are the same.

The easiest way to design the membrane to achieve the desired goal or goals is to use finite element simulations, although analytical calculations are also possible. The finite element simulator needs the material parameters, stress and stress gradient as input parameters for the simulations. The actual stress can be measured by wafer bow experiments. The stress gradient can be measured with special test structures (e.g. cantilevers or by a surface profile of a known membrane design and fitting the simulation to the measured deflection). The design can then be varied in the simulator until the desired properties are reached. For example: If the resonance frequency of the backplate is too high, then the slots can be elongated.

Various examples of implementation are described above. It should be clear that the design does not need to be perfectly radial as described above, but can also be random or arbitrarily segmented as long as the stress and stress gradient is relaxed or controlled as beneficial for the device performance.

Various modifications will be apparent to those skilled in the art.

The invention claimed is:

1. A MEMS device comprising:
    a fixed membrane; and
    a movable membrane separated by a gap,
    wherein movement of the movable membrane is sensed or controlled to provide operation of the device,
    wherein the fixed membrane comprises an array of holes including a set of holes which are provided adjacent an outer periphery of the fixed membrane, the set of holes including a plurality of rows of elongate holes, the rows at different distances from the periphery, wherein each hole has a hole shape defined by a first direction and axis and by a second direction and axis perpendicular to the first direction, the hole shape being generally symmetrical about each axis, and
    wherein an average stress of the fixed and movable membrane are selected such that a resonance frequency of the fixed and movable membranes are the same.

2. A device as claimed in claim 1, wherein the holes in one row are staggered with respect to the holes in another row.

3. A device as claimed in claim 1, wherein an elongate direction of each hole extends generally along a direction of the outer periphery which is along the first direction and axis.

4. A device as claimed in claim 3, wherein the holes in one row are a same width but a different length relative to the holes in an adjacent row.

5. A device as claimed in claim 1, wherein the fixed membrane is clamped alongside of the periphery of the fixed membrane, wherein the array of holes comprises a plurality of segments, wherein each said segment has a same effective bending moment, wherein said set of holes is contained in an outermost said segment.

6. A MEMS device comprising:
a fixed membrane; and
a movable membrane separated by a gap,
wherein movement of the movable membrane is sensed or controlled to provide operation of the device,
wherein the fixed membrane comprises an array of holes including a set of holes which are provided adjacent an outer periphery of the fixed membrane, the set of holes including a plurality of rows of elongate holes, the rows at different distances from the periphery, wherein each hole has a hole shape defined by a first direction and axis and by a second direction and axis perpendicular to the first direction, the hole shape being generally symmetrical about each axis, and
wherein the fixed membrane and the movable membrane are circular, and each row of holes of the set comprises a circle at a fixed radius.

7. A MEMS device comprising:
a fixed membrane; and
a movable membrane separated by a gap,
wherein movement of the movable membrane is sensed or controlled to provide operation of the device,
wherein the fixed membrane comprises an array of holes including a set of holes which are provided adjacent an outer periphery of the fixed membrane, the set of holes including a plurality of rows of elongate holes, the rows at different distances from the periphery, and
wherein within said set of holes, each said row has longer holes than the adjacent said row on the radial inner side, such that the hole length is proportional to the radial distance from the centre.

8. A device as claimed in claim 7, wherein within an innermost segment, nearest the centre, the holes also comprise a plurality of rows of elongate holes, the rows at different distances from the periphery, and the holes in one row being staggered with respect to the holes in another row.

9. A device as claimed in claim 8, wherein the elongate direction of each hole in the innermost segment extends generally along the direction of the outer periphery.

10. A device as claimed in claim 9, wherein the holes of the outermost row of the innermost segment are longer than the holes of the innermost row of an outermost segment of the fixed membrane.

11. A device as claimed in claim 8, wherein within an innermost segment, nearest the centre, the holes comprise a plurality openings of unity aspect ratio.

12. A device as claimed in claim 1, wherein the device is part of a microphone.

13. A device as claimed in claim 1, wherein at least some of the holes are tapered.

14. A device as claimed in claim 1, wherein the periphery is curved, and the fixed membrane is clamped, along its full perimeter.

15. A MEMS device comprising:
a fixed membrane; and
a movable membrane separated by a gap,
wherein movement of the movable membrane is sensed or controlled to provide operation of the device, and
wherein the fixed membrane comprises an array of holes including a set of holes which are provided adjacent an outer periphery of the fixed membrane, the set of holes including a plurality of rows of elongate holes, the rows at different distances from the periphery, wherein each hole has a hole shape defined by a first direction and axis and by a second direction and axis perpendicular to the first direction, the hole shape being generally symmetrical about each axis, and being defined in two dimensions wholly by a continuous concave portion of the fixed membrane.

16. The MEMS device of claim 15, wherein an elongate direction of each hole extends generally along a direction of the outer periphery which is along the first direction and axis.

17. The MEMS device of claim 15, wherein an elongate direction of each hole extends generally along a direction of the outer periphery which is along the first direction and axis, and some of the array and its holes are configured and arranged to optimize stress relaxation.

18. The MEMS device of claim 15, wherein at least some of the holes are defined by a circular or elliptical shape.

19. The MEMS device of claim 1, wherein at least some of the holes defined by a circular or elliptical shape.

* * * * *